(12) United States Patent
Narayanasetty et al.

(10) Patent No.: US 12,706,601 B2
(45) Date of Patent: Aug. 11, 2026

(54) SWITCH-BASED VOLTAGE TRANSLATOR

(71) Applicant: TEXAS INSTRUMENTS INCORPORATED, Dallas, TX (US)

(72) Inventors: Ajith Kumar Narayanasetty, Bangalore (IN); Sahil Garg, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/428,672

(22) Filed: Jan. 31, 2024

(65) Prior Publication Data

US 2025/0247090 A1 Jul. 31, 2025

(51) Int. Cl.
*H03K 17/00* (2006.01)
*H03K 17/16* (2006.01)

(52) U.S. Cl.
CPC .................................. *H03K 17/161* (2013.01)

(58) Field of Classification Search
CPC ........... H03K 19/00315; H03K 19/003; H03K 19/0175; H03K 19/01759; H03K 19/0185; H03K 19/018507; H03K 19/018521; H03K 19/018592
See application file for complete search history.

(56) References Cited

U.S. PATENT DOCUMENTS 4,216,390 A * 8/1980 Stewart .................. H03K 5/023 327/543
5,084,637 A * 1/1992 Gregor ........... H03K 19/018592 326/82
5,680,063 A * 10/1997 Ludwig .......... H03K 19/018592 326/119
6,373,284 B1 * 4/2002 Delage ........... H03K 19/018592 327/333
6,847,230 B2 * 1/2005 Mallory ........... H03K 19/01843 326/82
6,914,470 B2 * 7/2005 Watanabe ...... H03K 19/018521 327/108
6,954,100 B2 * 10/2005 Dharne ............ H03K 3/356113 327/333
2003/0132794 A1 * 7/2003 Watanabe ...... H03K 19/018592 327/333
2004/0052249 A1 * 3/2004 Fukuoka ............... G06F 1/3203 370/362
2009/0167356 A1 * 7/2009 Dover ............ H03K 19/018585 326/63

* cited by examiner

*Primary Examiner* — Tuan T Lam
(74) *Attorney, Agent, or Firm* — Xianghui Huang; Frank D. Cimino

(57) ABSTRACT

In an example, a system includes a first transistor having a control terminal, a first terminal, and a second terminal. The system also includes a resistor having first and second terminals, the first terminal of the resistor coupled to the control terminal of the first transistor, and the second terminal of the resistor coupled to a first voltage terminal. The system includes a second transistor having a control terminal, a first terminal, and a second terminal, where the first terminal of the second transistor is coupled to the control terminal of the first transistor and to the first terminal of the resistor, and the second terminal of the second transistor is coupled to the control terminal of the second transistor.

22 Claims, 3 Drawing Sheets

SWITCH-BASED VOLTAGE TRANSLATOR

BACKGROUND

Digital devices that interact with one another often have different supply voltages. A first device may use a 5 volt (V) supply, while a second device may operate with a 1.5 V supply. At times, the higher voltage device may drive the lower voltage device, or the lower voltage device may drive the higher voltage device. The voltage difference between the two devices may make the system non-functional. A voltage translation circuit, voltage translator, or level shifter may be useful for translating the signals between digital devices operating with different supply voltages.

SUMMARY

In accordance with at least one example of the description, a circuit includes a first transistor having a control terminal, a first terminal, and a second terminal. The circuit also includes a resistor having first and second terminals, the first terminal of the resistor coupled to the control terminal of the first transistor, and the second terminal of the resistor coupled to a first voltage terminal. The circuit includes a second transistor having a control terminal, a first terminal, and a second terminal, where the first terminal of the second transistor is coupled to the control terminal of the first transistor and to the first terminal of the resistor, and the second terminal of the second transistor is coupled to the control terminal of the second transistor.

In accordance with at least one example of the description, circuit includes a first transistor having a control terminal, a first terminal, and a second terminal. The circuit also includes a resistor having first and second terminals, the first terminal of the resistor coupled to the control terminal of the first transistor, and the second terminal of the resistor coupled to a first voltage terminal. The circuit includes a second transistor having a control terminal, a first terminal, and a second terminal, where the first terminal of the second transistor is coupled to the control terminal of the first transistor and to the resistor, and the second terminal of the second transistor is coupled to the control terminal of the second transistor. The circuit also includes a third transistor having a control terminal, a first terminal, and a second terminal, where the first terminal of the third transistor is coupled to the control terminal of the first transistor and to the first terminal of the second transistor, and where the control terminal of the third transistor is coupled to the second terminal of the third transistor and to the first voltage terminal.

In accordance with at least one example of the description, circuit includes a first transistor having a control terminal, a first terminal, and a second terminal, the first transistor configured to translate a voltage from a first voltage domain to a second voltage domain. The circuit also includes a resistor having first and second terminals, the first terminal of the resistor coupled to the control terminal of the first transistor, and the second terminal of the resistor coupled to a first voltage terminal configured to provide a first voltage, the resistor configured to bias the control terminal of the first transistor and to produce a voltage drop at the control terminal of the first transistor responsive to a leakage current in the first transistor. The circuit includes a second transistor having a control terminal, a first terminal, and a second terminal, where the first terminal of the second transistor is coupled to the control terminal of the first transistor and to the resistor, the second terminal of the second transistor is coupled to the control terminal of the second transistor, and the second transistor is configured to draw a leakage current responsive to the leakage current in the first transistor.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
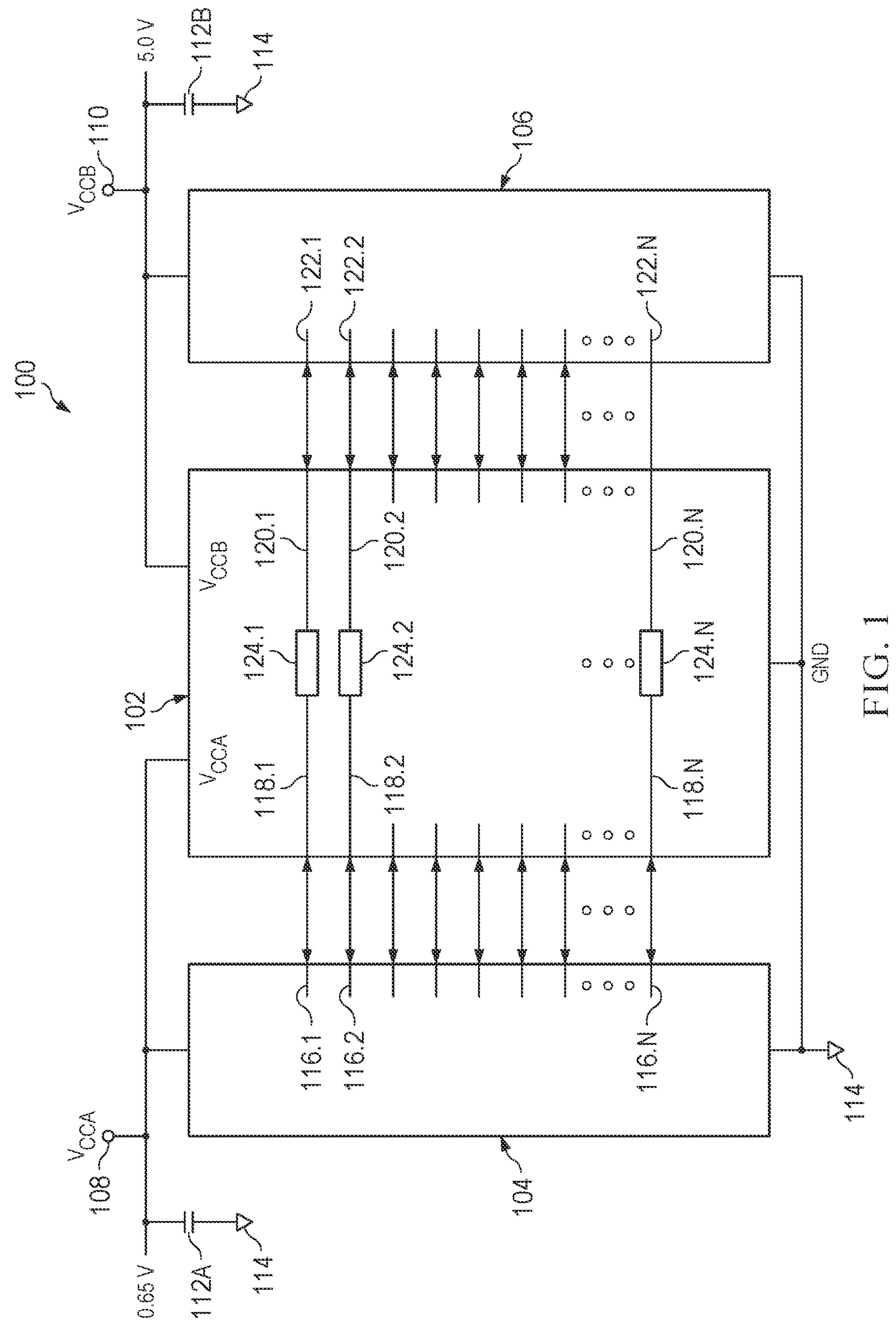
FIG. 1 is an example system for voltage translation.

Many digital devices are becoming smaller, faster, and more efficient. Some chips, circuits, systems, or voltage domains that operate with a 5 V power supply (or higher) often interface with systems that have a lower power supply, such as 3.3 V, 2.5 V, 1.8 V, or 0.65 V. To communicate with one another, mismatched systems have to reliably translate a logical 1 or a logical 0 from one voltage domain to another voltage domain in a predictable manner.

As digital devices move to smaller voltage supplies, voltage ranges as low as 0.65 V or lower are used. For example, a processor may have a supply voltage of 0.65 V, while a peripheral device coupled to the processor may use a 1.8 V supply. A field effect transistor (FET) or metal-oxide semiconductor FET (MOSFET) may provide voltage translation between two voltage domains. The FET works as a level shifter. The FET has a control terminal or gate terminal coupled to the lower voltage supply (e.g., 0.65 V). A first terminal of the FET (e.g., a source) is coupled to a pin or bus line of the lower supply voltage device and to a first pullup resistor, where the first pullup resistor is also coupled to the lower voltage supply. A second terminal of the FET (e.g., a drain) is coupled to a pin or bus line of the higher supply voltage device and to a second pullup resistor, where the second pullup resistor is also coupled to the higher voltage supply. If neither device pulls down the voltage at its respective pin or bus line, the pullup resistors pull up the voltage to the respective supply voltages at the source and the drain of the FET. At this time, the FET is not conducting, and the voltage levels at the pins are held high but at different voltage levels (e.g., a logical 1).

If the low voltage device pulls down the voltage at the source of the FET, the FET starts to conduct and the voltage at the drain of the FET is pulled down as well. At this time, both pins are held at a logical 0. If the high voltage device pulls down the voltage at the drain of the FET, the drain begins to behave as a source of the FET. The FET starts to conduct, which allows the source to also be pulled down. If both terminals are pulled down, then both pins are held at a logical 0 in this instance as well. The FET therefore operates as a level shifter to translate a logical 0 or a logical 1 from the low voltage domain to the high domain, or vice versa.

To support a lower voltage supply, such as 0.65 volts, a low voltage threshold FET is useful. A low voltage threshold FET is a FET that has a voltage threshold below 0.75 V in one example, or below 0.65 V in another example. Low voltage threshold FETs often have relatively high leakage current if they are off, compared to higher voltage threshold FETs. The leakage current is as high as 2 microamps per channel in some devices. If batteries are used for power supplies, the high leakage current may quickly drain the batteries.

In examples herein, a circuit for voltage translation is described that reduces leakage current. The circuit uses low voltage threshold devices in one example. The circuit includes a resistor and transistor coupled to the gate of the FET that functions as a level shifter. The resistor and transistor reduce the voltage at the gate of the FET in the presence of a leakage current in the FET. This reduced gate voltage, in turn, reduces the leakage current of the FET. The circuit described herein functions as a level shifter and reliably translates logical 1's and 0's between a high voltage domain and a low voltage domain. The circuit can translate voltages for low voltage domains that are at or below 0.65 V in some examples. The circuit may include discrete components or may be embedded within a chip or integrated circuit. In some examples, the chip has multiple copies of the circuit to provide voltage translation for a number of channels, such as 4 or 8 channels.

FIG. 1 is an example system 100 for voltage translation. System 100 includes a voltage translation chip 102, a first device 104, and a second device 106. System 100 also includes a first voltage terminal 108, second voltage terminal 110, capacitors 112A and 112B, and voltage terminal 114 (which is ground (GND) or a ground terminal in an example). First device 104 includes 8 channels 116 (e.g., 116.1, 116.2, . . . 116.N). Voltage translation chip 102 includes 8 channels 118 (e.g., 118.1, 118.2, . . . 118.N), each coupled to a channel 116 of first device 104. Voltage translation chip 102 also includes 8 channels 120 (e.g., 120.1, 120.2, . . . 120.N). Second device 106 includes 8 channels 122 (e.g., 122.1, 122.2, . . . 122.N) each coupled to a channel 120 of voltage translation chip 102. Voltage translation chip 102 also includes 8 voltage translation circuits 124 (e.g., 124.1, 124.2, . . . 124.N). Each voltage translation circuit 124 is coupled between a channel 118 and a channel 120 of voltage translation chip 102. The channels described herein may be coupled to a pin, node, terminal, bus line, or other connection of voltage translation chip 102, first device 104, or second device 106.

In system 100, voltage translation chip 102 is coupled between first device 104 and second device 106. In this example, voltage translation chip 102, first device 104, and second device 106 each have 8 channels. Voltage translation chip 102 translates voltages between first device 104 and second device 106 on each of the 8 channels. First device 104 is coupled to first voltage terminal 108, which provides a voltage $V_{CCA}$ to first device 104 from a first voltage source (not shown in FIG. 1). First device 104 is also coupled to voltage terminal 114. Second device 106 is coupled to second voltage terminal 110, which provides a voltage $V_{CCB}$ to second device 106 from a second voltage source (not shown in FIG. 1). Second device 106 is also coupled to voltage terminal 114. In one example, $V_{CCA}$ is a low voltage, such as 0.65 V. In one example, $V_{CCB}$ is a higher voltage than $V_{CCA}$, such as 5.0 V. Voltage translation chip 102 translates voltages between these two voltage domains as described below.

Capacitor 112A has a first terminal coupled to first voltage terminal 108 and a second terminal coupled to voltage terminal 114. Capacitor 112B has a first terminal coupled to second voltage terminal 110 and a second terminal coupled to voltage terminal 114. Capacitors 112A and 112B may filter noise from the voltage supplies (not shown) that produce $V_{CCA}$ and $V_{CCB}$.

Voltage translation chip 102 is coupled to first voltage terminal 108, second voltage terminal 110, and voltage terminal 114. Voltage translation chip 102 includes a voltage translation circuit 124 for each channel in voltage translation chip 102 (8 channels in this example, although any number of channels are present in other examples). Voltage translation circuits 124 include circuitry as described below with respect to FIGS. 2 and 3 in some examples. In some examples, voltage translation circuits 124 use low voltage threshold transistors and have lower leakage current than other systems.

As described below, voltage translation circuits 124 translate the logical signals (e.g., 0 or 1) between two different voltage domains. A logical 0 in first device 104 is provided at a channel 116, such as channel 116.1. Voltage translation chip 102 receives the logical 0 at channel 118.1. Voltage translation circuit 124 translates the logical 0 and provides a logical 0 at channel 120.1, which is coupled to channel 122.1 of second device 106. Therefore, second device 106 receives the logical 0. Likewise, a logical 0 at channel 122.1 of second device 106 is provided to first device 104 via voltage translation chip 102 and voltage translation circuit 124. A logical 1 may also be translated between first device 104 and second device 106 (or vice versa) in a similar manner.

Voltage translation circuits 124 translate low voltages, such as voltages less than 0.65 V or 0.75 V, to a higher voltage domain, such as 1.8 V, 3.3 V or 5 V. As described below, voltage translation circuits 124 have low voltage threshold transistors that allow for translation of logical signals from low voltage domains (such as 0.65 V) to higher voltage domains. Voltage translation circuits 124 also have lower leakage currents than other systems having low voltage threshold transistors.

Figure 2:
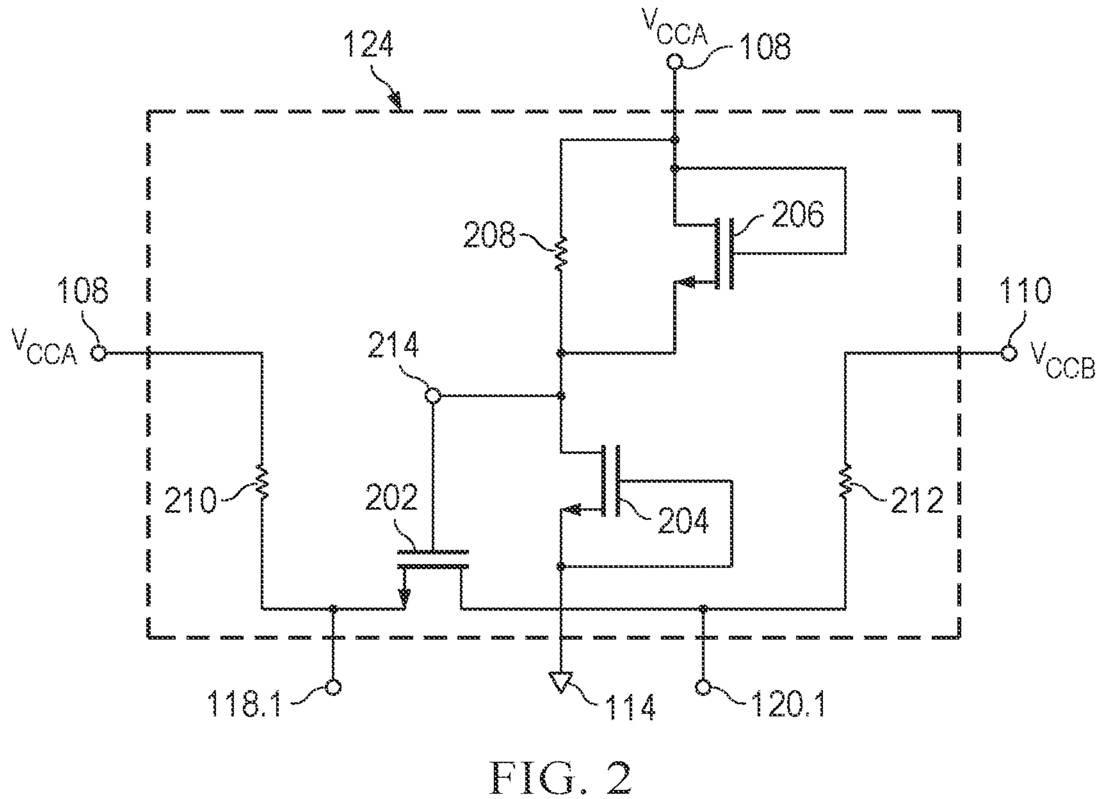
FIG. 2 is an example circuit for voltage translation.

FIG. 2 is an example voltage translation circuit 124. Voltage translation circuit 124 includes transistor 202, transistor 204, transistor 206, resistor 208, pullup resistor 210, pullup resistor 212. A node 214 is also shown. FIG. 2 includes components described above with respect to FIG. 1, including first voltage terminal 108, second voltage terminal 110, voltage terminal 114, channel 118.1, and channel 120.1. Channel 118.1 represents a channel in voltage translation chip 102 that is coupled to a low voltage domain device, such as first device 104. Channel 120.1 represents a channel in voltage translation chip 102 that is coupled to a high voltage domain device, such as second device 106.

Transistors 202, 204, and 206 may be low voltage threshold transistors. Low voltage threshold transistors are transistors that have a threshold below 0.75 V in one example, or below 0.65 V in another example. Transistors 202, 204, and 206 are n-channel FETs in one example.

In voltage translation circuit 124, transistor 202 has a control terminal (e.g., a gate), a first terminal, and a second terminal. The control terminal is coupled transistor 204, transistor 206, and resistor 208 at the node 214. The first terminal of transistor 202 is a source that is coupled to a first terminal of pullup resistor 210 and to channel 118.1. Pullup resistor 210 has a second terminal coupled to first voltage terminal 108. First voltage terminal 108 provides a voltage $V_{CCA}$ in one example, which is a voltage lower than $V_{CCB}$, and may be as low as 0.65 V or lower. The second terminal, e.g., the drain, is coupled to a first terminal of pullup resistor 212 and to channel 120.1. Pullup resistor 212 has a second terminal coupled to second voltage terminal 110. Second voltage terminal 110 provides a voltage $V_{CCB}$ in one example, which is a voltage higher than $V_{CCA}$, such as 1.8 V, 3.3 V, or 5 V.

Transistor 204 has a control terminal (e.g., a gate) coupled to its first terminal, which in this example is a source. The control terminal and source are coupled to voltage terminal 114 (e.g., ground). Transistor 204 has a second terminal, which in this case is a drain. The drain of transistor 204 is coupled to the control terminal of transistor 202, the source of transistor 206, and resistor 208 at node 214.

Transistor 206 has a first terminal that is a source in this example. The source of transistor 206 is coupled to the control terminal of transistor 202, resistor 208, and the drain of transistor 204, at the node 214. Transistor 206 has a control terminal (e.g., a gate) coupled to its second terminal (e.g., a drain) and to the resistor 208. The control terminal and drain are also coupled to first voltage terminal 108 in this example.

Resistor 208 has a first terminal coupled to first voltage terminal 108 and the control terminal and drain of transistor 206. Resistor 208 has a second terminal coupled to the control terminal of transistor 202, the drain of transistor 204, and the source of transistor 206 at node 214.

In an example level shifting operation, if neither first device 104 (coupled to channel 118.1) nor second device 106 (coupled to channel 120.1) pulls down the voltage at its respective pin or bus line, the pullup resistors 210 and 212 pull up the voltage to the respective supply voltages at the source and the drain of transistor 202. Transistor 202 is not conducting, and the voltage levels at the pins (e.g., channels 118.1 and 120.1) are held high but at different voltage levels (e.g., a logical 1).

If first device 104 pulls down the voltage at the source of transistor 202 by providing a logical 0 at channel 118.1, transistor 202 starts to conduct and the voltage at the drain of transistor 202 is pulled down as well. Therefore, a logical 0 at channel 118.1 is translated to a logical 0 at channel 120.1. If second device 106 pulls down the voltage at the drain of transistor 202 (e.g., at channel 120.1), a substrate diode of transistor 202 allows the source of transistor 202 to also be pulled down, and transistor 202 begins to conduct. The voltages at channels 118.1 and 120.1 are both held at a logical 0 in this instance as well. Transistor 202 therefore operates as a level shifter to translate a logical 0 or a logical 1 from the low voltage domain to the high domain, or vice versa.

In one example, transistor 202 is a low voltage threshold transistor that has a threshold voltage of about 0.65 V or less. Therefore, transistor 202 can translate voltages from a device with a low supply voltage (e.g., $V_{CCA}$ less than 0.75 V). When transistor 202 is off, a leakage current flows from the high voltage supply to the low voltage supply (e.g., from second voltage terminal 110 to first voltage terminal 108). In one example, the leakage current is around 2 microamps per channel. Transistor 202 may have a low on resistance when transferring data. However, as the transistor 202 gets smaller to provide the low threshold voltage, leakage currents may become more prominent due to process variations. If batteries are used for power supplies, the leakage currents are detrimental to the performance of the devices.

In an example, resistor 208 and transistor 204 provide a voltage drop between first voltage terminal 108 and the gate of transistor 202 (e.g., at node 214) to bias the gate of transistor 202. If transistor 202 has a leakage current when off, transistor 204 also has a leakage current. The leakage current of transistor 204 flows through resistor 208 and causes a voltage drop between first voltage terminal 108 and the gate of transistor 202 at node 214. This voltage drop lowers the voltage at the gate of transistor 202. Rather than the gate of transistor 202 having a voltage of $V_{CCA}$, the gate of transistor 202 has a voltage of $V_{CCA}$ minus the leakage current of transistor 204 multiplied by the value of resistor 208. In one example, resistor 208 is one megaohm, but other values of resistor 208 are useful in other examples. For example, a leakage current of 0.18 microamps through a 1 megaohm resistor 208 produces a voltage drop across resistor 208 of 0.18 V. Therefore, the voltage at the gate of transistor 202 is not $V_{CCA}$ (e.g., 0.65 V), but 0.65 V minus 0.18 V, or 0.47 V. The lower voltage value at the gate of transistor 202 reduces the leakage current through transistor 202. As leakage current increases, the voltage drop across resistor 208 increases, which in turn reduces the leakage current through transistor 202.

Transistor 206 is a diode connected transistor. If the voltage at the gate of transistor 202 (e.g., at node 214) drops, a voltage drop occurs across the source and drain of transistor 206. The voltage drop across the source and drain of transistor 206 turns on transistor 206. If transistor 206 is on, current from first voltage terminal 108 flows through transistor 206 to the gate of transistor 202 at node 214. Therefore, the voltage drop across resistor 208 does not occur or is less, and the voltage at the gate of transistor 202 does not drop too far for proper operation. Transistor 206 acts as a diode to prevent the voltage at the gate of transistor 202 from dropping too far.

In some examples, transistor 202 has a relatively large size to provide a large on resistance. The size of transistor 202 may be selected to provide a certain threshold voltage, and/or may be selected based on the values of $V_{CCA}$ and $V_{CCB}$. Transistor 202 may be larger than transistor 204. Transistor 202 may be 1 to 100 times the size of transistor 204. Transistor 204 may be larger than transistor 206, and may be 1 to 10 times the size of transistor 206. Transistors 204 and 206 are smaller than transistor 202 and have less leakage currents in some examples.

In other examples, transistors 202, 204, and/or 206 are transistors with higher threshold voltages rather than low voltage threshold transistors. Transistors 202, 204, and 206 have threshold voltages above 0.65 V in those examples. Another example voltage translation circuit that has reduced leakage current is described below with respect to FIG. 3.

Figure 3:
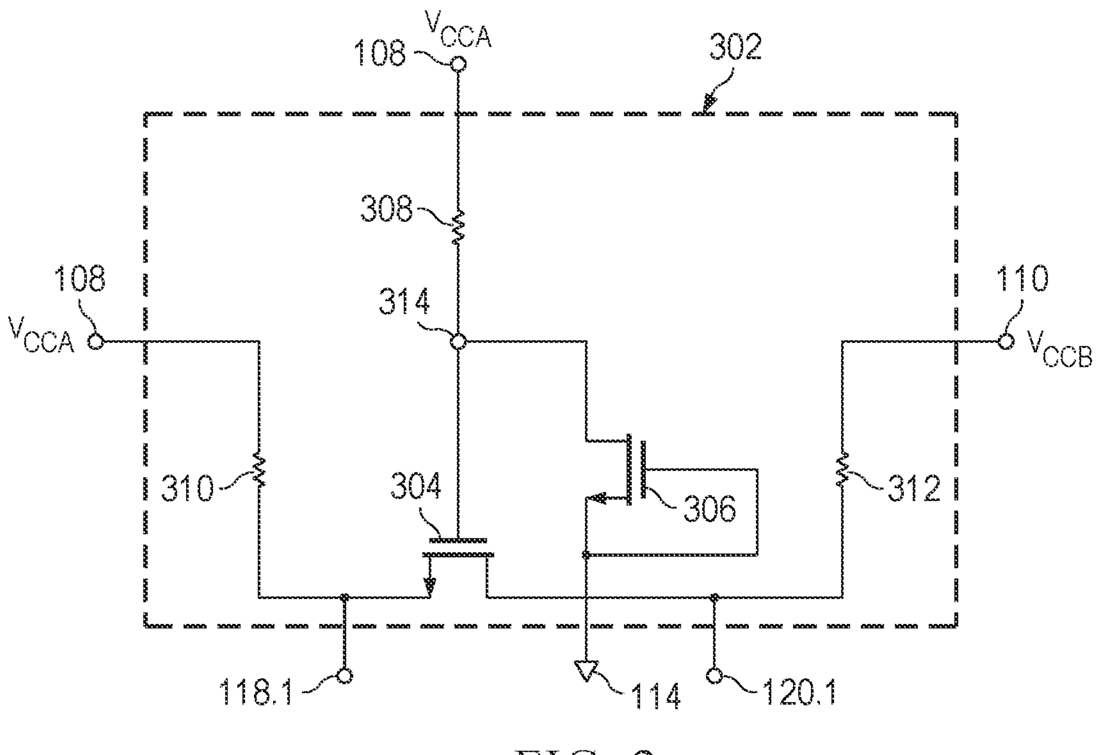
FIG. 3 is an example circuit for voltage translation.

FIG. 3 is an example voltage translation circuit 302, which may be implemented as a voltage translation circuit 124 of FIG. 1. Voltage translation circuit 302 includes transistor 304, transistor 306, resistor 308, pullup resistor 310, pullup resistor 312. A node 314 is also shown. FIG. 3 includes components described above with respect to FIGS. 1 and 2, including first voltage terminal 108, second voltage terminal 110, voltage terminal 114, channel 118.1, and channel 120.1. Channel 118.1 represents a channel in voltage translation chip 102 that is coupled to a low voltage domain device, such as first device 104. Channel 120.1 represents a channel in voltage translation chip 102 that is coupled to a high voltage domain device, such as second device 106. Voltage translation circuit 302 operates similarly to voltage translation circuit 124 described above, but without the presence of the diode-connected transistor 206.

Transistors 304 and 306 are low voltage threshold transistors in one example. Low voltage threshold transistors are transistors that have a threshold below 0.75 V in one example, or below 0.65 V in another example. Transistors 304 and 306 are n-channel FETs in one example.

In voltage translation circuit 302, transistor 304 has a control terminal (e.g., a gate), a first terminal, and a second terminal. The control terminal is coupled to transistor 306 and resistor 308 at node 314. The first terminal is a source that is coupled to a first terminal of pullup resistor 310 and to channel 118.1. Pullup resistor 310 has a second terminal coupled to first voltage terminal 108. First voltage terminal 108 provides a voltage $V_{CCA}$ in one example, which is a voltage lower than $V_{CCB}$, and is as low as 0.65 V or lower.

Transistor 304 has a second terminal that is a drain and that is coupled to a first terminal of pullup resistor 312 and to channel 120.1. Pullup resistor 312 has a second terminal coupled to second voltage terminal 110. Second voltage terminal 110 provides a voltage $V_{CCB}$ in one example, which is a voltage higher than $V_{CCA}$, such as 1.8 V, 3.3 V, or 5 V.

Transistor 306 has a control terminal (e.g., a gate) coupled to its first terminal, which is be a source in this example. The control terminal and source are coupled to voltage terminal 114 (e.g., ground). Transistor 306 has a second terminal that is a drain. The drain is coupled to the control terminal of transistor 304 and resistor 308 at node 314.

Resistor 308 has a first terminal coupled to first voltage terminal 108. Resistor 308 has a second terminal coupled to the control terminal of transistor 304 and the drain of transistor 306 at node 314.

The level shifting operation of voltage translation circuit 302 works as described above with respect to FIG. 2. Voltage translation circuit 302 translates a logical 0 or a logical 1 between first device 104 and second device 106.

In an example, resistor 308 and transistor 306 provide a voltage drop between first voltage terminal 108 and the gate of transistor 304 (e.g., at node 314). If transistor 304 has a leakage current when off, transistor 306 also has a leakage current. The leakage current of transistor 306 flows through resistor 308 and causes a voltage drop between first voltage terminal 108 and the gate of transistor 304 at node 314. This voltage drop lowers the voltage at the gate of transistor 304. Rather than the gate of transistor 304 having a voltage of $V_{CCA}$, the gate of transistor 304 has a voltage of $V_{CCA}$ minus the leakage current of transistor 306 multiplied by the value of resistor 308. In one example, resistor 308 is one megaohm, but other values of resistor 308 are useful in other examples. The lower voltage value at the gate of transistor 304 reduces the leakage current through transistor 304. As leakage current increases, the voltage drop across resistor 308 increases, which in turn reduces the leakage current through transistor 304.

In some examples, transistor 304 has a relatively large size to provide a large on resistance. The size of transistor 304 may be selected to provide a certain threshold voltage, and/or may be selected based on the values of $V_{CCA}$ and $V_{CCB}$. Transistor 304 may be larger than transistor 306. Transistor 304 may be 1 to 100 times the size of transistor 306. Transistor 306 is smaller than transistor 304 and has less leakage current in some examples.

In examples herein, a circuit for voltage translation is described that reduces leakage current compared to other systems. Leakage currents are one-half to one-tenth as high compared to other systems. The circuits described herein use low voltage threshold devices in some examples. The circuits described herein are useful for voltage translation, but are useful in other applications as well to provide lower leakage currents. The circuits described herein provide for accurate voltage translation for devices that have lower operating voltages, such as operating voltages below 0.75 V. Power consumption is reduced and battery life is extended in some examples.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component.

What is claimed is:

1. A voltage translation circuit comprising:

first and second channel terminals;

first and second supply terminals;

a first transistor having a control terminal, a first terminal coupled to the first channel terminal, and a second terminal coupled to the second channel terminal;

a resistor having first and second terminals, the first terminal of the resistor coupled to the control terminal of the first transistor, and the second terminal of the resistor coupled to the first supply terminal;

a second transistor having a control terminal, a first terminal, and a second terminal, wherein the first terminal of the second transistor is coupled to the control terminal of the first transistor and to the first terminal of the resistor, and the second terminal of the second transistor is coupled to the control terminal of the second transistor, and to the first supply terminal; and a third transistor having a control terminal, a first terminal, and a second terminal, wherein the first terminal of the third transistor is coupled to the control terminal of the first transistor and to the first terminal of the second transistor, and wherein the control terminal of the third transistor is coupled to the second terminal of the third transistor and to the second supply terminal.

2. The voltage translation circuit of claim 1, further comprising:

a first resistor having first and second terminals, the first terminal of the first resistor coupled to the first terminal of the first transistor, and the second terminal of the first resistor coupled to the first supply terminal; and a second resistor having first and second terminals, the first terminal of the second resistor coupled to the second terminal of the first transistor, and the second terminal of the second resistor coupled to a third supply terminal.

3. The voltage translation circuit of claim 1, wherein the first transistor is at least twice a size of the second transistor.

4. The voltage translation circuit of claim 1, wherein the first transistor has a threshold voltage below 0.75 volts.

5. The voltage translation circuit of claim 1, wherein the voltage translation circuit is integrated in an integrated circuit.

6. The voltage translation circuit of claim 1, further comprising:

a first resistor coupled between the first channel terminal and the first supply terminal; and a second resistor coupled between the second channel terminal and a third supply terminal.

7. The voltage translation circuit of claim 2, wherein the first supply terminal is configured to supply a first voltage, the second supply terminal is a ground terminal, and the third supply terminal is configured to supply a second voltage that is different than the first voltage.

8. The voltage translation circuit of claim 7, wherein the first voltage is lower than 0.75 volts, and the second voltage is higher than 0.75 volts.

9. A circuit comprising:

a first transistor having a control terminal, a first terminal, and a second terminal;

a resistor having first and second terminals, the first terminal of the resistor coupled to the control terminal of the first transistor, and the second terminal of the resistor coupled to a first voltage terminal;

a second transistor having a control terminal, a first terminal, and a second terminal, wherein the first terminal of the second transistor is coupled to the control terminal of the first transistor and to the resistor, and the second terminal of the second transistor is coupled to the control terminal of the second transistor; and a third transistor having a control terminal, a first terminal, and a second terminal, wherein the first terminal of the third transistor is coupled to the control terminal of the first transistor and to the first terminal of the second transistor, and wherein the control terminal of the third transistor is coupled to the second terminal of the third transistor and to a second voltage terminal.

10. The circuit of claim 9, further comprising:

a first pullup resistor having first and second terminals, the first terminal of the first pullup resistor coupled to the first terminal of the first transistor, and the second terminal of the first pullup resistor configured to receive a first voltage from the first voltage terminal; and a second pullup resistor having first and second terminals, the first terminal of the second pullup resistor coupled to the second terminal of the first transistor, and the second terminal of the second pullup resistor configured to receive a second voltage from a third voltage terminal, wherein the first voltage is different than the second voltage.

11. The circuit of claim 10, wherein the first voltage from the first voltage terminal is less than 0.75 volts, and the second voltage from the third voltage terminal is higher than 0.75 volts.

12. The circuit of claim 9, wherein the control terminal of the second transistor is coupled to a ground terminal.

13. The circuit of claim 9, wherein the first transistor is at least twice a size of the second transistor.

14. The circuit of claim 9, wherein the first transistor has a threshold voltage below 0.75 volts.

15. The circuit of claim 9, further comprising:

a first device having a supply terminal coupled to the first voltage terminal, and a first terminal coupled to the first terminal of the first transistor; and a second device having a supply terminal coupled to a third voltage terminal, and a first terminal coupled to the second terminal of the first transistor.

16. A circuit comprising:

a first transistor having a control terminal, a first terminal, and a second terminal, the first transistor configured to translate a voltage from a first voltage domain to a second voltage domain;

a resistor having first and second terminals, the first terminal of the resistor coupled to the control terminal of the first transistor, and the second terminal of the resistor coupled to a first voltage terminal configured to provide a first voltage, the resistor configured to bias the control terminal of the first transistor and to produce a voltage drop at the control terminal of the first transistor responsive to a leakage current in the first transistor;

a second transistor having a control terminal, a first terminal, and a second terminal, wherein the first terminal of the second transistor is coupled to the control terminal of the first transistor and to the resistor, the second terminal of the second transistor is coupled to the control terminal of the second transistor, and the second transistor is configured to draw a leakage current responsive to the leakage current in the first transistor; and a third transistor having a control terminal, a first terminal, and a second terminal, wherein the first terminal of the third transistor is coupled to the control terminal of the first transistor and to the first terminal of the second transistor, wherein the control terminal of the third transistor is coupled to the second terminal of the third transistor and to a second voltage terminal, and wherein the third transistor is configured to hold a voltage at the control terminal of the first transistor above a threshold responsive to the leakage current in the first transistor.

17. The circuit of claim 16, further comprising:

a first pullup resistor having first and second terminals, the first terminal of the first pullup resistor coupled to the first terminal of the first transistor, and the second terminal of the first pullup resistor coupled to the first voltage terminal, the first pullup resistor configured to pull up a voltage at the first terminal of the first transistor for voltage translation; and a second pullup resistor having first and second terminals, the first terminal of the second pullup resistor coupled to the second terminal of the first transistor, and the second terminal of the second pullup resistor coupled to a third voltage terminal configured to provide a second voltage, wherein the first voltage is different than the second voltage, and wherein the second pullup resistor is configured to pull up a voltage at the second terminal of the first transistor for voltage translation.

18. The circuit of claim 17, wherein the first pullup resistor is configured to receive a first voltage from the first voltage terminal less than 0.75 volts.

19. The circuit of claim 18, wherein the second pullup resistor is configured to receive a second voltage from the second voltage terminal higher than 0.75 volts.

20. The circuit of claim 16, wherein the control terminal of the second transistor is coupled to a ground terminal.

21. The circuit of claim 16, wherein the first transistor and the second transistor each have a threshold voltage below 0.75 volts.

22. The circuit of claim 16, further comprising:

a first device configured to operate in the first voltage domain, the first device coupled to the first terminal of the first transistor; and a second device configured to operate in the second voltage domain, the second device coupled to the second terminal of the first transistor.

* * * * *